United States Patent [19]
Shao et al.

[11] Patent Number: 5,654,043
[45] Date of Patent: Aug. 5, 1997

[54] PULSED PLATE PLASMA IMPLANTATION SYSTEM AND METHOD

[75] Inventors: Jiqun Shao, Newton; A. Stuart Denholm, Lincoln, both of Mass.

[73] Assignee: Eaton Corporation, Cleveland, Ohio

[21] Appl. No.: 728,000

[22] Filed: Oct. 10, 1996

[51] Int. Cl.$^6$ ............................................. C23C 14/14
[52] U.S. Cl. .................... 427/527; 118/50.1; 118/620; 118/723 R; 118/723 MP; 118/723 E; 204/164; 427/255; 427/444; 427/523; 427/524; 427/534; 427/535; 427/547; 427/571; 427/572; 427/574; 427/578
[58] Field of Search ........................... 427/255, 444, 427/523, 524, 534, 535, 547, 571, 572, 574, 578; 118/50.1, 620, 723 R, 723 MP, 723 E; 204/164

[56] References Cited

U.S. PATENT DOCUMENTS 4,434,036  2/1984  Hoerschelmann et al. ............. 204/164
4,764,394  8/1988  Conrad ..................................... 427/38

FOREIGN PATENT DOCUMENTS

WO93/18201  9/1993  WIPO .

OTHER PUBLICATIONS

Cheung, Nathan W., "Plasma Immersion Ion Implantation for ULSI Processing", *Nuclear Instruments and Methods in Physics Research*, B55, pp. 811–820 (1991). (No month avail.).

Hinson, Dr. David C., *The Basics of Plasmas*, Materials Research Corporation, pp. I–1 to I–36 (1984). (no month avail.).

Lieberman, Michael A., et al., *Principles of Plasma Discharges and Materials Processing*, John Wiley & Sons, Inc., pp. 526–539 (1994). (no month available).

*Primary Examiner*—Bernard Pianalto
*Attorney, Agent, or Firm*—Watts, Hoffmann, Fisher & Heinke, Co., L.P.A.

[57]  ABSTRACT

Method and apparatus for treating a workpiece implantation surface by causing ions to impact the workpiece implantation surface. An implantation chamber defines a chamber interior into which one or more workpieces can be inserted. A support positions one or more workpieces within an interior region of the implantation chamber so that implantation surfaces of the workpieces are facing the interior region. A dopant material in the form of a gas is injected into the implantation chamber to cause the gas to occupy a region of the implantation chamber in close proximity to the one or more workpieces. A plasma of implantation material is created within the interior region of the implantation chamber. First and second conductive electrodes positioned within the implantation chamber include conductive surfaces in proximity to the chamber interior occupied by the one or more workpieces. A voltage source outside the chamber relatively biases the first and second conductive electrodes. A control circuit utilizes the voltage source for repeatedly relatively biasing the first and second conductive electrodes to energize the electrodes with a sequence of pulses that both ionize the gas molecules injected into the chamber and accelerate the ionized gas molecules toward the implantation surfaces of the one or more workpieces.

21 Claims, 4 Drawing Sheets

PULSED PLATE PLASMA IMPLANTATION SYSTEM AND METHOD

FIELD OF THE INVENTION

The present invention concerns a workpiece treatment system that immerses a workpiece to be treated into a plasma of particles that are accelerated to impact the workpiece. One such system immerses one or more workpieces into a plasma containing positively charged ions that are subsequently accelerated toward the surface of silicon wafers to dope the wafers with a controlled concentration of the ions.

BACKGROUND OF THE INVENTION

Commercially available ion implantation systems employ an ion source that includes a source chamber spaced from an implantation chamber where one or more workpieces are treated by ions from the source. An exit opening in the source chamber allows ions to exit the source so they can be shaped, analyzed, and accelerated to form an ion beam. The ion beam is directed along an evacuated beam path to the ion implantation chamber where the ion beam strikes one or more workpieces, typically circular wafers that have been placed within the implantation chamber. The energy of the ion beam is sufficient to cause ions which strike the wafers to penetrate those wafers in the implantation chamber. In a typical application of such a system the wafers are silicon wafers and the ions are used to "dope" the wafers to create a semiconductor material. Selective implantation with the use of masks and passivation layers allows an integrated circuit to be fabricated with such a prior art implanter.

U.S. Pat. No. 4,764,394 to Conrad entitled "Method and Apparatus for Plasma Source Ion Implantation" discloses an ion implantation system for treating a target by means of ionic bombardment. Ion implantation into surfaces of a three dimensional target is achieved by forming an ionized plasma about the target within an enclosing chamber. Once the plasma is set up in a region surrounding the target, ions from the plasma are driven into the target object from all sides without need to manipulate the target. This implantation is accomplished by application of repetitive pulses of high voltage, typically 20 kilovolts or higher, that cause the ions to be driven into exposed surfaces of the target. A technique discussed in the U.S. Pat. No. '394 patent for setting up the plasma is to introduce a neutral gas into the region of the target and then ionize the gas with ionizing radiation.

The system disclosed in the U.S. Pat. No. '394 patent to Conrad sets up, by using a separate ion source, an ion plasma in a region surrounding a workpiece and then selectively pulses with negative voltage an electrode that supports the workpiece to attract the positive ions in the plasma to the workpiece. Structure and method constructed in accordance with the present invention accomplish both plasma creation and workpiece treatment with one sequence of energization pulses.

DISCLOSURE OF THE INVENTION

The present invention concerns treatment of a workpiece by particle bombardment of the workpiece. An implantation chamber is provided that has a chamber interior. A conductive workpiece support acts as one electrode and positions one or more workpieces within the chamber interior. The chamber has a conductive wall portion that bounds the chamber interior and serves as a second electrode.

One or more workpieces are inserted into the implantation chamber and placed onto the conductive support so that treatment surfaces of the one or more workpieces face an interior region of the implantation chamber. A workpiece treatment material in the form of neutrally charged gas molecules is injected into the implantation chamber so that the gas occupies a region of the implantation chamber in close proximity to the one or more workpieces supported by the conductive support.

A biasing voltage is applied between the conductive workpiece support, which forms one electrode, and the conductive wall portion of the implantation chamber, which forms a second electrode. The biasing voltage is most preferably a sequence of electric pulses for relatively biasing the first and second electrodes to both ionize the gas molecules injected into the chamber and accelerate charged particles resulting from this ionization toward the treatment surfaces of the one or more workpieces.

Our specific use of the invention is in implanting controlled concentrations of ions into silicon wafers to dope the wafers. Experience has shown that suitable concentrations of implantation dose can be achieved with suitable ion doping materials.

It is believed that the present invention has particular application in implanting a flat panel display or the like wherein a large surface area workpiece is treated by ion bombardment. Flat panel displays are fabricated from a substrate of glass or the like having a coating of either a polysilicon or amorphous silicon applied to one surface. The coated substrate is inserted into the ion implantation chamber and treated by ion bombardment.

Practice of the present invention has certain advantages over prior art ion implanters having an ion source spaced from an implantation station by relatively lengthy evacuated ion beam paths. The cost of manufacturing an ion implanter constructed in accordance with the invention should be less due to elimination of the plasma sources and the power supplies for such a source. The size of the process chamber can be reduced since the gap between the electrodes that create the plasma within the chamber can be made relatively small. The cost of operation of such an implanter may be reduced since the size of the system, the power consumption and the maintenance are simpler to perform. For two closely adjacent plates of a suitable material, such as aluminum coated by silicon for example, the contamination of the implanter may be reduced as the plasma is confined between the two plates. The ability to treat large cross section workpieces such as flat panel displays is enhanced since only the size of electrodes need be increased to increase the size of the workpiece that can be treated. Uniformity of implantation is also very good and variations of about or less than 1% can be achieved.

Use of the disclosed techniques for setting up a plasma is not limited to ion implantation. The disclosed techniques can also be used for plasma etching or ashing. If the polarity of the pulsing applied to the first and second electrodes is reversed, the workpiece can be treated with electrons, which in certain instances such as treatment of photoresists can be useful. In general, positive or negative voltages can be applied to either one of the first and second electrodes and the other electrode can be kept at a reference, typically ground potential.

These and other objects, advantages, and features of the invention will be better understood from the accompanying detailed description of a preferred embodiment of the invention when reviewed in conjunction with the accompanying drawings.

DETAILED DESCRIPTION

Figure 1:
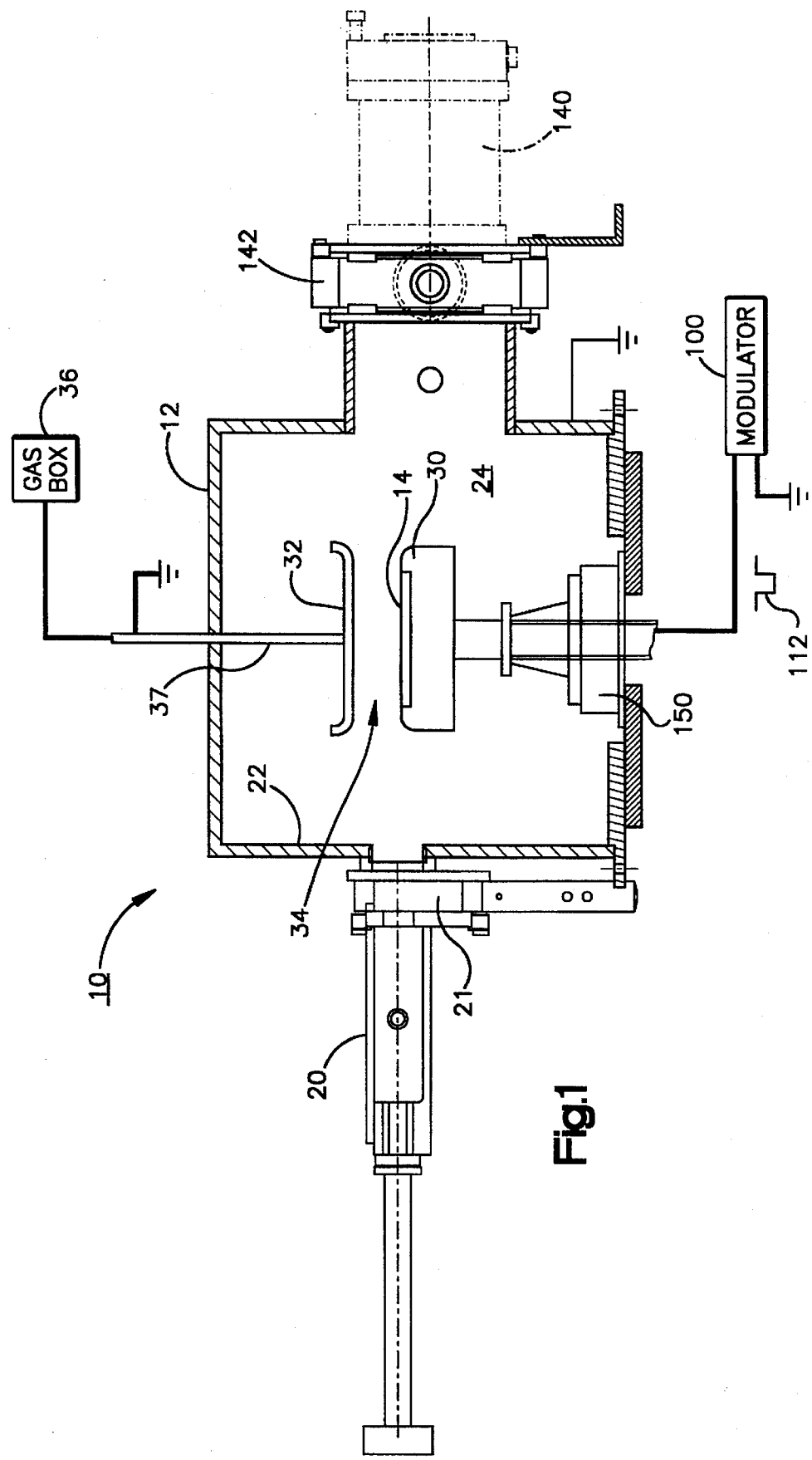
FIG. 1 is a schematic of an ion implantation system constructed in accordance with a preferred embodiment of the present invention.

FIG. 1 is an overview schematic of an ion implantation system 10 that includes a process chamber 12 into which generally planar workpieces 14 are inserted for ion treatment of those workpieces. The system depicted in FIG. 1 includes a loadlock 20 for inserting individual wafers into the process chamber 12 one at a time. The use of a loadlock allows the process chamber 12 to be maintained at a reduced pressure (in relation to atmospheric pressure) as workpieces are placed into and withdrawn from the chamber 12 by means of a valve 21 that is opened and closed as workpieces are inserted into and retrieved from the process chamber 12.

The process chamber 12 depicted in FIG. 1 has inner walls 22 that define a chamber interior 24 into which a workpiece 14 has been inserted. The workpiece 14 is placed onto a generally planar conductive platen or support 30. The platen 30 may have any suitable dimensions depending, for example, on the size of the workpiece to be supported by the platen 30.

Spaced above the workpiece platen is a gas delivery manifold 32 that injects an ionizable gas to a region 34 between the manifold and the workpiece 14. This region 34 above the workpiece is a region wherein an ion plasma is created during operation of the implantation system 10. Gas molecules not ionized and implanted are withdrawn from the chamber through exit openings 35. For one embodiment, as illustrated in FIGS. 2A and 2B, the exit openings 35 are formed beneath the platen 30.

A gas supply 36 outside the chamber delivers an ionizable gas through an inlet 37 passing through a chamber wall into the manifold which defines multiple diverging passageways leading from the inlet 37 to an array of openings 40 (FIGS. 2A and 2B) facing the workpiece 14. Good treatment uniformity is obtained by keeping the gas density in the region 34 between the manifold and the workpiece 14 as uniform as possible. A preferred manifold 32 is generally circular in plan and includes an array of openings 40 to maintain the gas concentration as uniform as possible around the outer perimeter of the manifold. In this regard, the workpieces 14 are placed onto the platen 30 spaced inwardly from the edge of the generally circular platen 30 to avoid potentially non-uniform regions of the plasma. Uniform implantation may also be ensured by suitable design of the shape of the edges of the platen 30 as the first electrode and the manifold 32 as the second electrode to control the electrical field strength at the edges of the electrodes.

Once the gas enters the plasma region 34 the gas molecules are ionized (stripped of one or more electrons) and the positively charged atoms are accelerated toward the workpiece by a sequence of negative voltage pulses that are applied to the conductive platen 30 (FIG. 2A) while the manifold 32 is maintained at a ground potential. In certain applications the polarity of voltages applied to the platen 30 and manifold 32 could be reversed, resulting in electrons accelerated to impact the workpiece. In the disclosed embodiment a single workpiece is shown supported on the platen 30, but multiple workpieces could also be simultaneously implanted using the present invention.

Figure 2A:
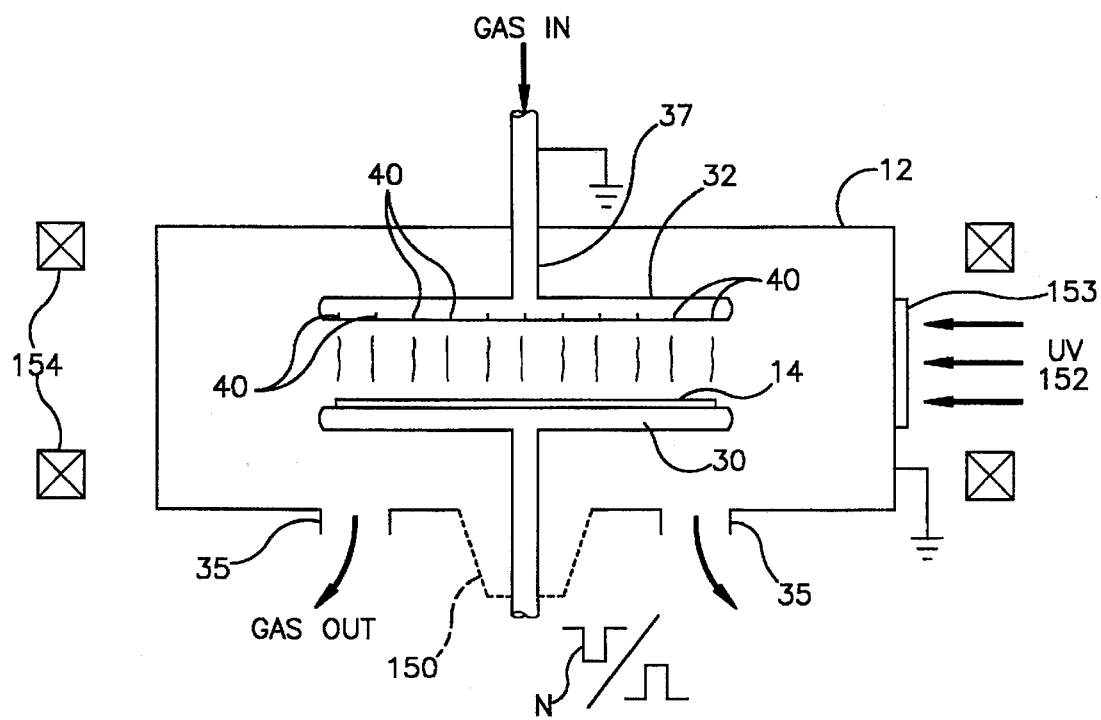
FIGS. 2A and 2B are enlarged schematic representations of a process chamber containing a cathode and an anode for setting up a plasma within the process chamber.
Figure 2B:
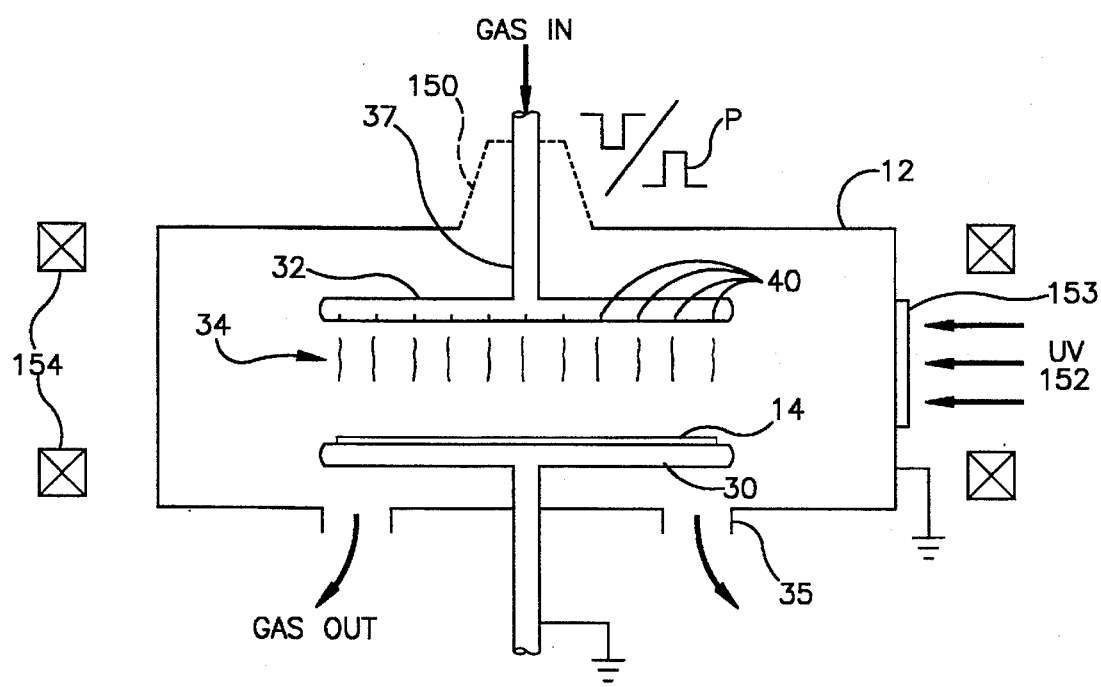

FIGS. 2A and 2B illustrate four different relative biasing arrangements used for creating a concentration of workpiece treatment material in the region 34 above the workpiece 14. In FIG. 2A the manifold 32 and chamber walls are grounded. In this configuration negative voltage pulses N applied to the conductive support platen 30 cause ions to be created by the relatively high electric field in the region 34 and accelerated toward the platen. In the FIG. 2B embodiment, the support platen 30 is grounded and the voltage pulses are applied to the manifold 32. In this arrangement positive voltage pulses P accelerate positively charged ions toward the workpiece 14.

A modulator circuit 100 located outside the chamber 12 applies voltage pulses across the platen 30 as one electrode and the manifold 32 as another electrode to relatively bias the conductive platen 30 and the conductive manifold 32. Any one of a number of commercially acceptable voltage sources are suitable for supplying voltage pulses.

A preferred modulator circuit 100 includes a voltage source controlled by relatively high power solid state switches that provides a sequence of pulses 112 that both ionize the gas molecules injected into the chamber and accelerate the ionized gas molecules toward implantation surfaces of the one or more workpieces 14. The repetition rate and pulse duration of the pulses 112 are chosen to assure that a glow discharge is developed and a plasma is formed and maintained in the region 34 by the pulses applied to the two electrodes 30, 32. The plasma density can decay in a time on the order of milliseconds due to recombination and diffusion after the ionization pulse is removed. To maintain the plasma continuously, a pulse rate of thousands per second or greater is necessary. However, at lower pulse rates, the ionization and implantation are still occurring during each pulse but provide a lower implantation rate.

To help reduce contamination, the platen 30 and the manifold 32 for one embodiment are formed of aluminum coated by silicon. Lining at least a portion of the chamber walls 22 and/or the non-working area of the platen 30 with a suitable insulating material, such as quartz for example, also helps to reduce contamination as well as power consumption.

Figure 3:
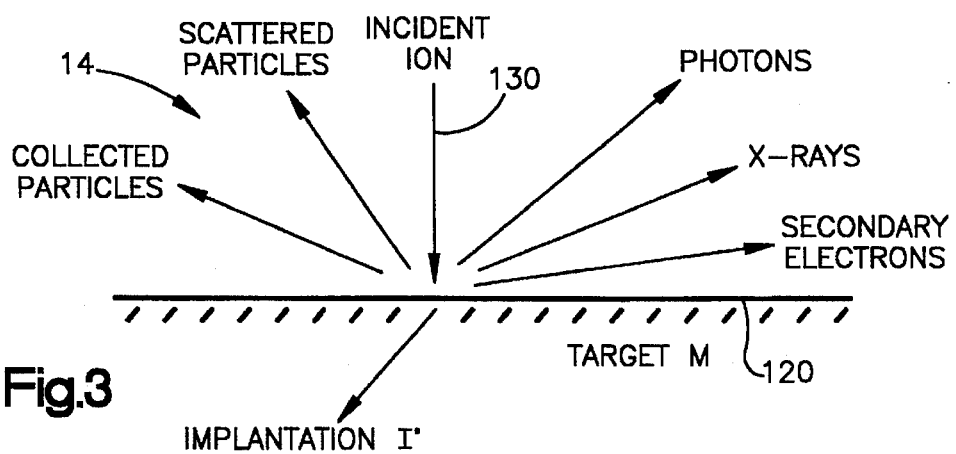
FIG. 3 is a schematic depiction showing alternate possible interactions between ions impacting a surface of a workpiece.
Figure 4:
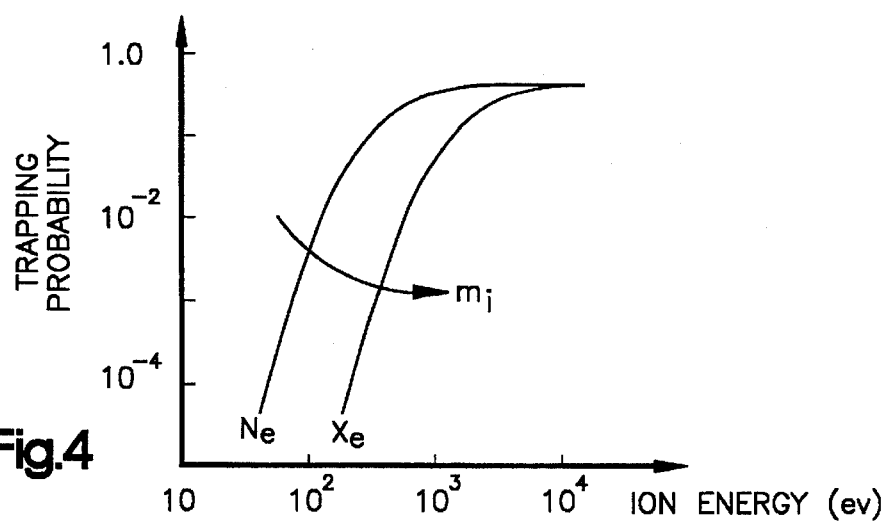
FIG. 4 is a graph showing the probability of ion implantation as a function of ion energy and mass when the ion impacts a workpiece.

FIG. 3 illustrates possible reactions occurring at a treatment surface 120 of a workpiece 14 as ions 130 from the ion plasma region 34 strike the surface 120. The possible ion-surface interactions illustrated in FIG. 3 give rise to both inelastic (production of photons, X-rays, secondary electrons, as well as ion implantation) and elastic (sputtering and reflected particles) reactions. An incident ion 130 can be trapped in a solid lattice of the workpiece 14 and this is ion implantation. A trapping probability n is depicted in the graph of FIG. 4 and as expected, increases with increasing ion energy E and decreasing ion mass m. At higher energies (E>10 keV) the trapping probability n=1, regardless of ion mass. The ion energy is mainly determined by the sheath voltage of the plasma, which in turn is dictated by the pulse voltage supplied by the modulator 100. The trapping probability is also affected by gas pressure, since ions may lose part of their energy due to collisions with gas molecules before they reach the surface 120.

Use of a loadlock 20 for inserting the workpiece 14 into the chamber allows the interior of the chamber 12 to remain evacuated between implants. A vacuum pump 140 maintains the chamber interior at a reduced pressure that is regulated by a valve 142 inserted between the chamber 12 and the pump 140. The same pump 140 can alternatively be coupled to the gas exit openings 35.

Silicon wafers have been implanted with a nitrogen dopant material in accordance with the present invention. Nitrogen gas is fed from the source 36 into the chamber 12 through an aluminum manifold 32 which delivers the nitrogen gas through several passageways extending through the manifold 32 which open outwardly into the chamber interior. The entire chamber 12 shown in FIG. 2A is grounded except the wafer support 30 which supports silicon wafers that are inserted into the chamber via the load lock 20. To allow the support 30 to be pulsed, an insulator 150 separates the walls of the chamber from the support 30. Side walls and the bottom of the chamber are protected by quartz hardware. Nitrogen plasma is generated by negatively pulsing the wafer support 30 with, for example, a pulse width of five microseconds at a pulse repetition rate of 2000 pps.

The threshold pulse voltage at which a glow discharge is developed depends on the type of gas introduced into the chamber 12, the gas pressure, and the spacing of the electrodes 30, 32 which determines the electric field strength achieved for a given amplitude of voltage pulse.

The pulse voltage needed to create the required ionization can also be affected by other external inputs to the region 34. These inputs are shown in FIG. 2A and 2B to include a radiation source 152 which directs UV or other suitable radiation through a window 153 in the chamber sidewall. Helmholtz coils 154 can also be positioned relative to the region 34 to set up an optional magnetic field in the region 34. The coils 154 may be positioned inside or outside the chamber 12 relative to the region 34. For another embodiment, permanent magnets may be used to set up a magnetic field in the region 34.

Experience in accordance with the present invention indicates that without a magnetic field, the plasma is set up within the chamber at a voltage of −3.6 kV with respect to the grounded chamber walls. With the same spacing between electrodes and a magnetic field of 40 gauss generated by the Helmholtz coils 154, a plasma is initiated at a reduced voltage of −1.8 kV. The dose rate is related to gas pressure and pulse conditions. With implant conditions of V=−5 kV having a pulse width of 4 microseconds and a pulse rate of 5000 Hz, dose rates from $4 \times 10^{13}$ cm$^2$/sec to $2 \times 10^{15}$ cm$^2$/sec were obtained depending on the gas pressure.

Figure 6:
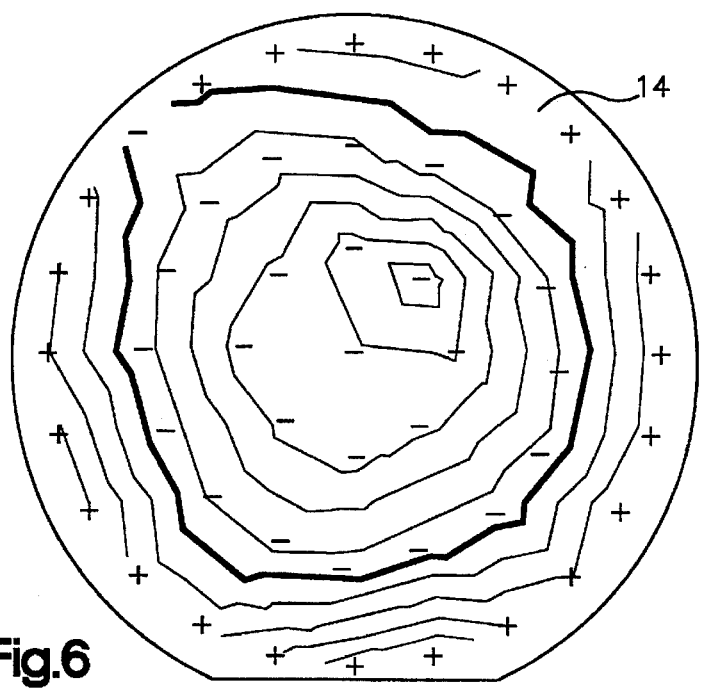
FIG. 6 is a graph showing doping uniformity for the six inch wafer that was implanted with boron.
Figure 5:
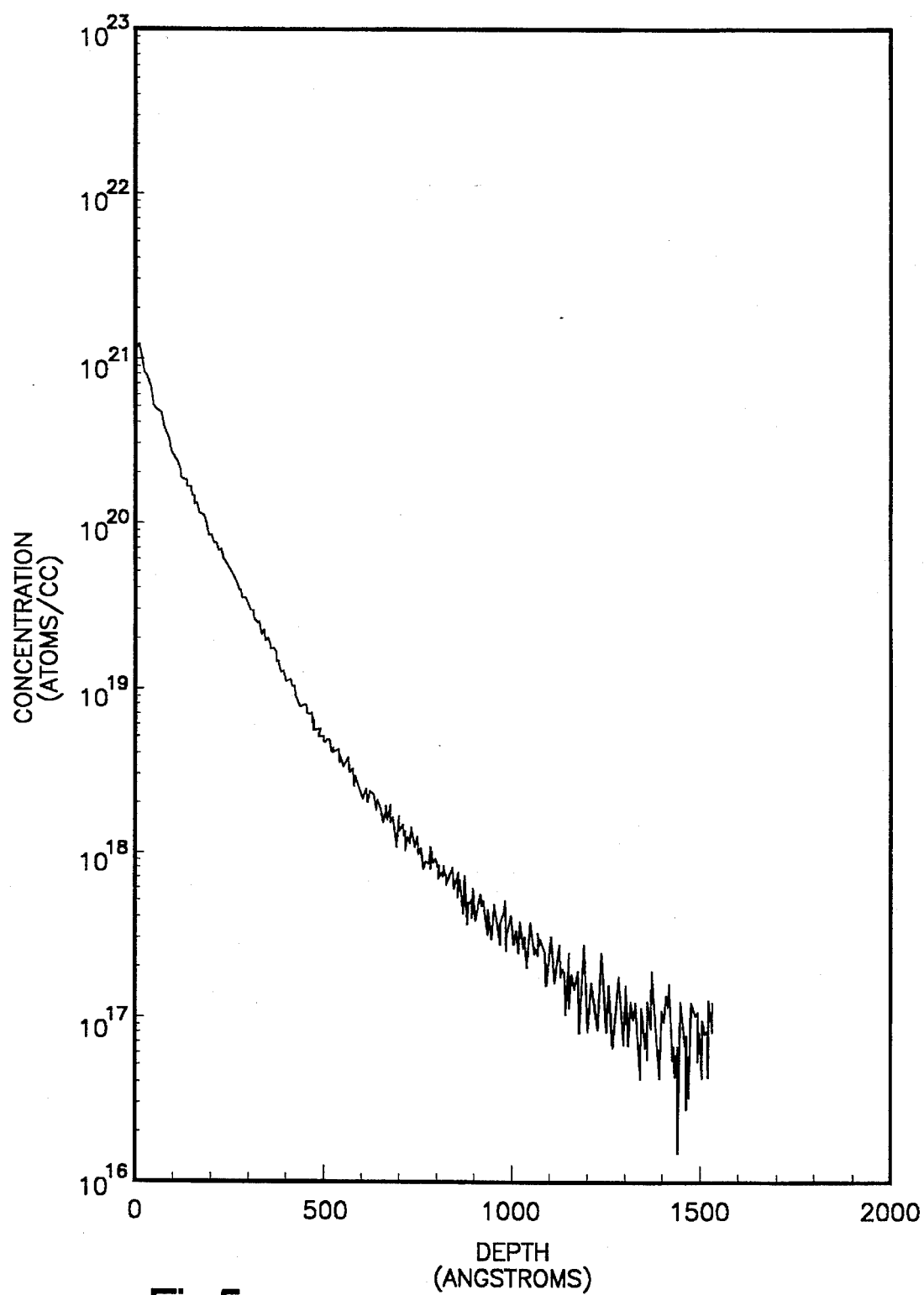
FIG. 5 is a graph showing ion implantation concentration as a function of depth beneath the wafer surface for an implantation of a six inch diameter wafer conducted with boron derived from boron triflouride gas molecules.

Doping using the present invention has been conducted on six inch diameter silicon wafers with good uniformity. FIG. 5 illustrates a boron doping profile (concentration in atoms per cubic centimeter as a function of distance from the surface of the wafer) by using boron-triflouride pulsed plate plasma implantation. FIG. 6 is a depiction of the doping uniformity that was achieved while doping these six inch silicon wafers with boron followed by rapid thermal annealing. The FIG. 6 depiction is the map of the sheet resistance measured with a 4 point probe, which is similar to a topographical map. Instead of equal lines of elevation, FIG. 6 shows equal lines of sheet resistance. An average sheet resistance is shown with the solid bold line. The generally concentric lines radially inward and outward from the solid bold line indicate progressive sheet resistances above and below the average. The overall deviation from the mean or average sheet resistance across the surface of the wafer 14 is about 1%.

While the present invention has been described with a degree of particularity, it is the intent that the invention include all modifications and alterations from the disclosed design falling within the spirit or scope of the pending claims.

What is claimed is:

1. A method of treating one or more workpieces comprising the steps of:

(a) inserting one or more workpieces into an interior of a treatment chamber and supporting the one or more workpieces on a conductive workpiece support such that a treatment surface of the one or more workpieces faces a treatment region in the interior of the treatment chamber, the treatment chamber having a conductive wall portion that bounds the interior of the treatment chamber;

(b) injecting a treatment material comprising neutrally charged gas molecules into the treatment chamber such that the gas molecules occupy the treatment region; and (c) repeatedly relatively biasing the conductive workpiece support and the conductive wall portion of the treatment chamber by applying voltage pulses to ionize the gas molecules injected into the treatment chamber and to accelerate resulting charged particles to impact the treatment surface of the one or more workpieces.

2. The method of claim 1, wherein the repeatedly relatively biasing step (c) comprises the step of repeatedly negatively biasing the conductive workpiece support with respect to the conductive wall portion of the treatment chamber to ionize the gas molecules injected into the treatment chamber and to accelerate resulting positively charged ions to impact the treatment surface of the one or more workpieces.

3. The method of claim 1, wherein the repeatedly relatively biasing step (c) comprises the step of repeatedly positively biasing the conductive workpiece support with respect to the conductive wall portion of the treatment chamber to ionize the gas molecules injected into the treatment chamber and to accelerate resulting electrons to impact the treatment surface of the one or more workpieces.

4. The method of claim 1, wherein the repeatedly relatively biasing step (c) comprises the step of applying voltage pulses to the conductive workpiece support while maintaining the conductive wall portion at a reference electric potential.

5. The method of claim 1, wherein the repeatedly relatively biasing step (c) comprises the step of applying voltage pulses to the conductive wall portion while maintaining the conductive workpiece support at a reference electric potential.

6. The method of claim 1, comprising the step of providing a magnetic field in the treatment region of the treatment chamber.

7. The method of claim 1, comprising the step of providing radiation in the treatment region of the treatment chamber.

8. The method of claim 1, wherein the voltage pulses applied to bias the conductive workpiece support and the conductive wall portion have a pulse rate, width, and magnitude sufficient to maintain a relatively constant level of ion plasma concentration in the interior of the treatment chamber.

9. The method of claim 8, wherein the voltage pulses are on the order of microseconds in duration and have a pulse repetition rate on the order of thousands of hertz.

10. An apparatus for treating one or more workpieces comprising:
   (a) a treatment chamber defining a chamber interior and having a conductive wall portion that bounds the chamber interior;
   (b) a conductive workpiece support for supporting one or more workpieces in the chamber interior of the treatment chamber;
   (c) an injector for injecting a treatment material comprising gas molecules into the treatment chamber such that the gas molecules occupy a treatment region proximal to one or more workpieces supported by the conductive workpiece support; and
   (d) control circuitry for repeatedly relatively biasing the conductive workpiece support and the conductive wall portion of the treatment chamber, the control circuitry comprising a voltage source for providing a sequence of voltage pulses that both ionize the gas molecules injected into the treatment chamber and accelerate resulting charged particles to impact a treatment surface of the one or more workpieces.

11. The apparatus of claim 10, wherein the conductive wall portion comprises the injector.

12. The apparatus of claim 10, wherein the control circuitry repeatedly negatively biases the conductive workpiece support with respect to the conductive wall portion of the treatment chamber to ionize the gas molecules injected into the treatment chamber and to accelerate resulting positively charged ions to impact the treatment surface of the one or more workpieces.

13. The apparatus of claim 10, wherein the control circuitry repeatedly positively biases the conductive workpiece support with respect to the conductive wall portion of the treatment chamber to ionize the gas molecules injected into the treatment chamber and to accelerate resulting electrons to impact the treatment surface of the one or more workpieces.

14. The apparatus of claim 10, wherein the voltage source applies voltage pulses to the conductive workpiece support and wherein the control circuitry maintains the conductive wall portion at a reference electric potential.

15. The apparatus of claim 10, wherein the voltage source applies voltage pulses to the conductive wall portion and wherein the control circuitry maintains the conductive workpiece support at a reference electric potential.

16. The apparatus of claim 10, wherein the conductive workpiece support is supported by an insulating portion of the treatment chamber.

17. The apparatus of claim 10, wherein the injector comprises a manifold for delivering the gas molecules into the chamber interior.

18. The apparatus of claim 17, wherein the manifold comprises a conductive material and is supported by an insulating portion of the treatment chamber, and
   wherein the voltage source applies voltage pulses to the conductive manifold to relatively bias the conductive manifold with respect to the conductive workpiece support.

19. The apparatus of claim 10, wherein at least a portion of the chamber interior and a non-working area of the conductive workpiece support is lined with an insulating material.

20. The apparatus of claim 10, comprising a magnet for setting up a magnetic field in the treatment region of the treatment chamber.

21. The apparatus of claim 10, comprising a radiation source for providing radiation in the treatment region of the treatment chamber.

* * * * *